(12) United States Patent
Bernard et al.

(10) Patent No.: US 9,403,365 B2
(45) Date of Patent: Aug. 2, 2016

(54) METHOD FOR FABRICATING FLUID EJECTION DEVICE

(75) Inventors: David Bernard, Lexington, KY (US); Andrew Mcnees, Lexington, KY (US); James Mrvos, Lexington, KY (US)

(73) Assignee: FUNAI ELECTRIC CO., LTD. (JP)

( * ) Notice: Subject to any disclaimer, the term of this patent is extended or adjusted under 35 U.S.C. 154(b) by 1097 days.

(21) Appl. No.: 13/097,549

(22) Filed: Apr. 29, 2011

(65) Prior Publication Data

US 2012/0273597 A1 Nov. 1, 2012

(51) Int. Cl.
*B41J 2/16* (2006.01)
*H01L 21/265* (2006.01)

(52) U.S. Cl.
CPC .............. *B41J 2/1603* (2013.01); *B41J 2/1628* (2013.01); *B41J 2/1631* (2013.01); *B41J 2/1632* (2013.01); *B41J 2/1645* (2013.01); *H01L 21/265* (2013.01); *Y10T 29/49083* (2015.01); *Y10T 29/49401* (2015.01)

(58) Field of Classification Search
CPC ...... B41J 2/1603; B41J 2/1628; B41J 2/1631; B41J 2/1632; B41J 2/1645; H01L 21/265; Y10T 29/49083; Y10T 29/49401
USPC ........... 29/611, 890.1, 830, 846; 438/21, 200, 438/229; 347/56, 58, 63, 65
See application file for complete search history.

(56) References Cited

U.S. PATENT DOCUMENTS

| 4,224,733 | A  | * | 9/1980 | Spadea ........................ 438/229 |
| 7,244,014 | B2 | * | 7/2007 | Goin et al. ..................... 347/65 |
| 7,600,856 | B2 | * | 10/2009 | Lebens et al. .................. 347/56 |
| 2009/0229125 | A1 | * | 9/2009 | Kato et al. ........ Y10T 29/49401 |

FOREIGN PATENT DOCUMENTS

JP 05177837 A * 7/1993 ............... 29/890.1 X

* cited by examiner

*Primary Examiner* — A. Dexter Tugbang
(74) *Attorney, Agent, or Firm* — Amster, Rothstein Ebenstein LLP

(57) ABSTRACT

A method for fabricating a fluid ejection device includes forming a drive circuitry layer on a substrate, fabricating at least one fluid ejection element on a top portion of the substrate, grinding the substrate from a bottom portion of the substrate up to a predetermined height, etching the top portion of the substrate to configure at least one slot within the top portion of the substrate, depositing a layer of an etch-stop material over the top portion of the substrate while filling the at least one slot with the etch-stop material, etching the bottom portion of the substrate to configure at least one fluid feed trench within the bottom portion of the substrate, removing the layer of the etch-stop material from the top portion of the substrate, and laminating a flow feature layer and a nozzle plate as a single unit over the top portion of the substrate.

5 Claims, 10 Drawing Sheets

METHOD FOR FABRICATING FLUID EJECTION DEVICE

CROSS REFERENCES TO RELATED APPLICATIONS

None.

STATEMENT REGARDING FEDERALLY SPONSORED RESEARCH OR DEVELOPMENT

None.

REFERENCE TO SEQUENTIAL LISTING, ETC.

None.

BACKGROUND

1. Field of the Disclosure

The present disclosure relates generally to fluid ejection devices for printers, and more particularly, to a method for fabricating a fluid ejection device.

2. Description of the Related Art

A typical fluid ejection device (printhead) for printer, such as an inkjet printer, includes a substrate (silicon wafer) carrying at least one fluid ejection element thereupon; a flow feature layer configured over the substrate; and a nozzle plate configured over the flow feature layer. The nozzle plate and the flow feature layer of the fluid ejection device are generally formed as thick layers of polymeric materials. Further, the fluid ejection device includes a drive circuitry layer that may be made using complementary metal-oxide-semiconductor implantation. Such a drive circuitry layer is electrically coupled with the at least one fluid ejection element, and assists in electrically connecting the fluid ejection device to the printer during use.

FIGS. 1-8 depict a typical process flow for fabrication of a fluid ejection device 100. FIG. 1 depicts a substrate 110 having a top portion 112 and a bottom portion 114. FIG. 2 depicts formation of a drive circuitry layer 130 on the substrate 110. Subsequently, fluid ejection elements 150, 170 are fabricated on the substrate 110, as depicted in FIG. 3. Each fluid ejection element of the fluid ejection elements 150, 170 is electrically coupled to the drive circuitry layer 130. Thereafter, the substrate 110 is subjected to grinding from the bottom portion 114 thereof up to a predetermined height, 'H1' (referring to FIGS. 2 and 3). Subsequently, a planarization layer 190 (polymeric layer) is formed over the top portion 112, and particularly over selective regions (not numbered) of the top portion 112 of the substrate 110, as depicted in FIG. 4. Thereafter, exposed regions (not numbered), i.e., without any planarization layer 190, of the top portion 112 of the substrate 110 are etched using Deep Reactive Ion Etching (DRIE) technique to form/configure at least one slot, such as slots 116, 118 within the top portion 112 of the substrate 110, as depicted in to FIG. 5. The at least one slot serves as a fluid via of the fluid ejection device 100.

Subsequently, a layer 210 of an etch-stop material is then deposited over the exposed regions of the top portion 112 of the substrate 110 while filling the slots 116, 118 with the etch-stop material, as depicted in FIG. 6. Thereafter, the bottom portion 114 of the substrate 110 is etched to form/ configure at least one fluid feed trench, such as a fluid feed trench 120, within the bottom portion 114 of the substrate 110, as depicted in FIG. 7. The fluid feed trench 120 is in fluid communication with the slots 116, 118. Subsequently, the layer 210 of the etch-stop material is removed from the top portion 112 of the substrate 110, as depicted in FIG. 7. Thereafter, a nozzle plate 230 (Photo-imageable layer) is formed over the planarization layer 190. The planarization layer 190 serves as the flow feature layer of the fluid ejection device 100.

However, such a method of fabricating fluid ejection devices is incapable of allowing aggressive post-DRIE cleanups while avoiding any damage to the flow feature layers. Specifically, available DRIE etching processes and strip methods are limited by the presence of the flow feature layers and the necessity of keeping the flow feature layers intact for permanent bonding of the nozzle plates. More specifically, clean-ups after DRIE etching processes may affect the adhesion of the nozzle plates to the flow feature layers. Further, performing DRIE etching processes post formation of the flow feature layers has also facilitated in corrosion (manifestations such as ink ingression) of the fluid ejection devices.

In addition, application of DRIE etching processes that employ hydrophobic polymers in masking and passive layers, proves to be unsuitable as the hydrophobic polymers are difficult and expensive to remove in the presence of the flow feature layers. Thus, many prior art methods that employ such DRIE etching processes for fabricating fluid ejection devices are cost-ineffective.

Accordingly, there persists a need for an efficient and a cost-effective method for fabricating fluid ejection devices for printers without causing any damage to flow feature layers and nozzle plates of the fluid ejection devices.

SUMMARY OF THE DISCLOSURE

In view of the foregoing disadvantages inherent in the prior art, the general purpose of the present disclosure is to provide a method for fabricating a fluid ejection device, by including all the advantages of the prior art, and overcoming the drawbacks to inherent therein.

In one aspect, the present disclosure provides a method for fabricating a fluid ejection device. The method includes forming a drive circuitry layer on a substrate. The method further includes fabricating at least one fluid ejection element on the substrate. Each fluid ejection element of the at least one fluid ejection element is electrically coupled to the drive circuitry layer. Furthermore, the method includes forming at least one slot within a top portion of the substrate. In addition, the method includes forming at least one fluid feed trench within a bottom portion of the substrate. Each fluid feed trench of the at least one fluid feed trench is in fluid communication with one or more slots of the at least one slot. Moreover, the method includes laminating a flow feature layer and a nozzle plate over the substrate having the at least one slot and the at least one fluid feed trench formed therewithin.

In another aspect, the present disclosure provides a method for fabricating a fluid ejection device. The method includes forming a drive circuitry layer on a substrate. Further, the method includes fabricating at least one fluid ejection element on a top portion of the substrate. Each fluid ejection element of the at least one fluid ejection element is electrically coupled to the drive circuitry layer. Furthermore, the method includes grinding the substrate from a bottom portion of the substrate up to a predetermined height. In addition, the method includes etching the top portion of the substrate to form at least one slot within the top portion of the substrate. Moreover, the method includes depositing a layer of an etch-stop material over the top portion of the substrate while filling the at least one slot with the etch-stop material. Additionally, the method includes etching the bottom portion of the substrate to form at least one fluid feed trench within the bottom portion of the substrate. Each fluid feed trench of the at least one fluid feed trench is in fluid communication with one or more slots of the at least one slot. Further, the method includes removing the layer of the etch-stop material from the top portion of the substrate. The method also includes laminating a flow feature layer and a nozzle plate over the top portion of the substrate having the at least one slot and the at least one fluid feed trench formed therewithin.

In yet another aspect, the present disclosure provides a fluid ejection device. The fluid ejection device includes a substrate. The substrate includes a top portion and a bottom portion; at least one slot formed within the top portion of the substrate; and at least one fluid feed trench formed within the bottom portion of the substrate. Each fluid feed to trench of the at least one fluid feed trench is in fluid communication with one or more slots of the at least one slot. The fluid ejection device further includes a drive circuitry layer formed on the substrate. Furthermore, the fluid ejection device includes at least one fluid ejection element fabricated on the top portion of the substrate and electrically coupled to the drive circuitry layer. Additionally, the fluid ejection device includes a flow feature layer laminated over the top portion of the substrate having the at least one slot and the at least one fluid feed trench formed therewithin. Also, the fluid ejection device includes a nozzle plate laminated over the flow feature layer. The at least one slot and the at least one fluid feed trench are formed within the substrate prior to the lamination of the flow feature layer and the nozzle plate.

BRIEF DESCRIPTION OF THE DRAWINGS

The above-mentioned and other features and advantages of the present disclosure, and the manner of attaining them, will become more apparent and will be better understood by reference to the following description of embodiments of the disclosure taken in conjunction with the accompanying drawings, wherein.

DETAILED DESCRIPTION

It is to be understood that various omissions and substitutions of equivalents are contemplated as circumstances may suggest or render expedient, but these are intended to cover the application or implementation without departing from the spirit or scope of the claims of the present disclosure. It is to be understood that the present disclosure is not limited in its application to the details of components set forth in the following description. The present disclosure is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Further, the terms "a" and "an" herein do not denote a limitation of quantity, but rather denote the presence of at least one of the referenced item.

Figure 1:
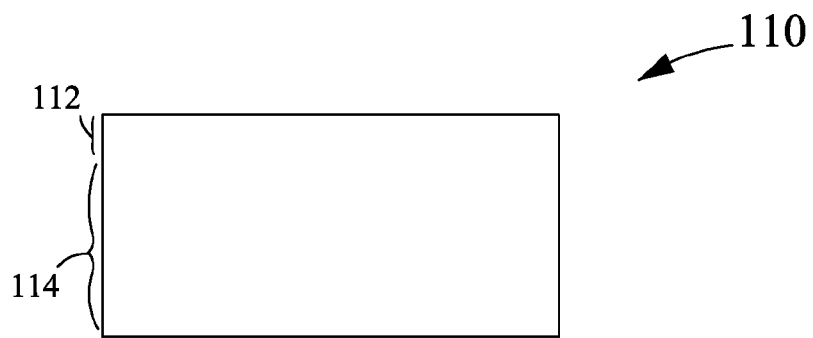
FIGS. 1-8 depict a prior art process flow for fabrication of a fluid ejection device.
Figure 2:
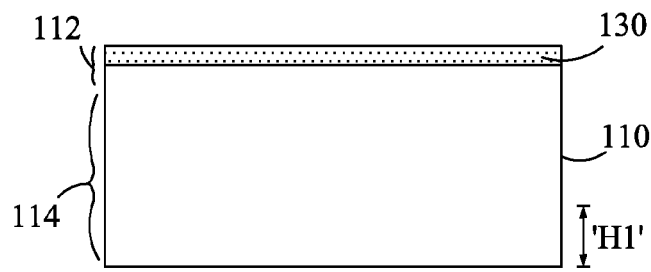
Figure 3:
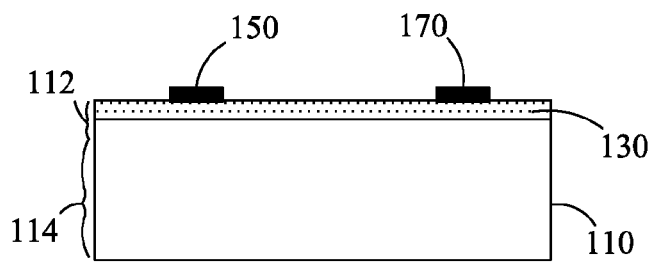
Figure 4:
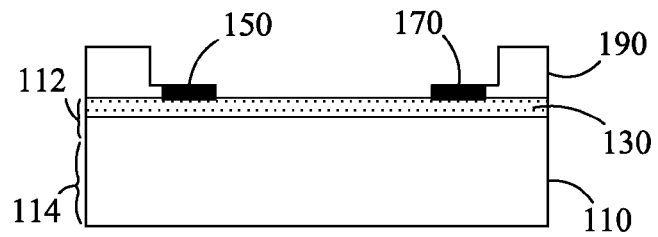
Figure 5:
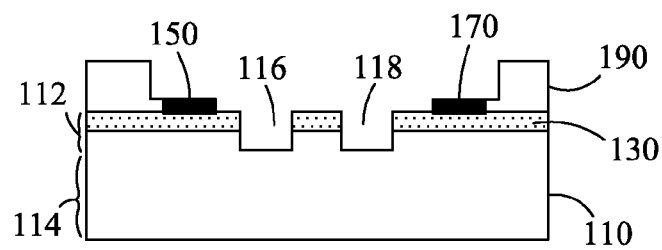
Figure 6:
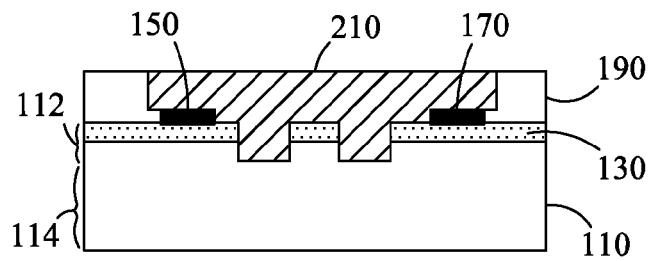
Figure 7:
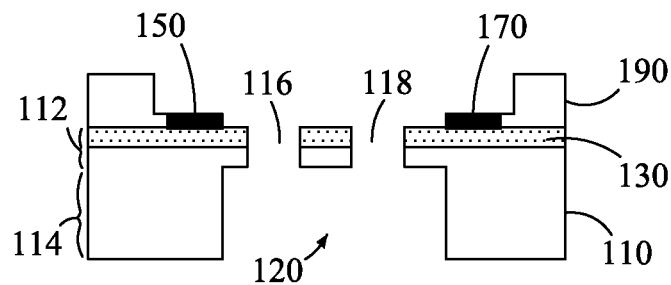
Figure 8:
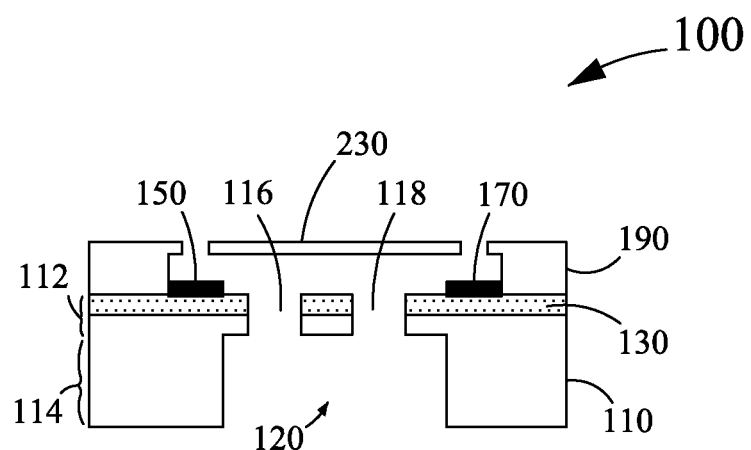
Figure 9:
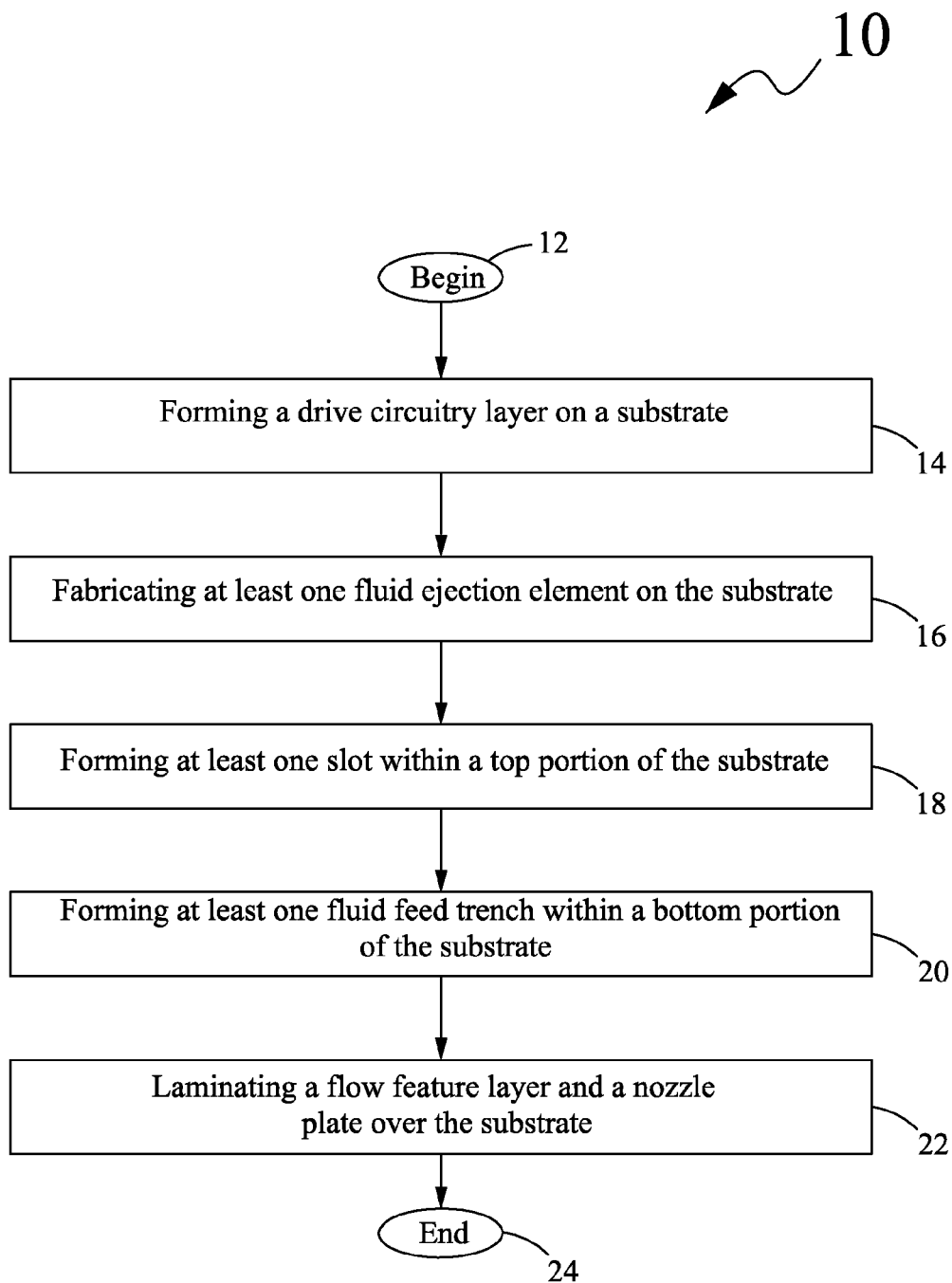
FIG. 9 depicts a flow chart illustrating a method for fabricating a fluid ejection device, in accordance with an embodiment of the present disclosure.

The present disclosure provides a method for fabricating a fluid ejection device. The fluid ejection device is in the form of a printhead for use in printers, such as inkjet printers. The method for fabrication of the fluid ejection device is explained in conjunction with FIGS. 9 and 10-15. FIG. 9 depicts a flow chart illustrating a method 10 for fabricating a fluid ejection device 300, in accordance with an embodiment of the present disclosure. FIGS. 10-15 depict a process flow for the fabrication of the fluid ejection device 300 using the method 10 of FIG. 9.

Figure 10:
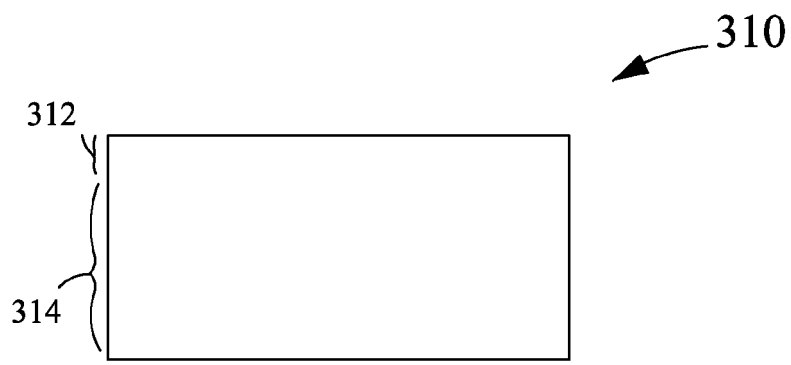
FIGS. 10-15 depict a process flow for the fabrication of the fluid ejection device using the method of FIG. 9.
Figure 11:
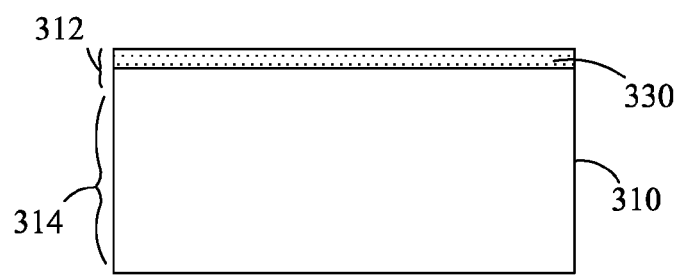

Referring to FIG. 9, the method 10 begins at 12. A substrate 310 is provided, as depicted in FIG. 10. The substrate 310 is a silicon wafer and may have a height of about 725 micrometers ($\mu m$). Without departing from the scope of the present disclosure, the substrate 310 may have any shape and size as per a manufacturer's preference. Further, the substrate 310 may be composed of any other semi-conductor material that is suitable for the fabrication of fluid ejection devices. The substrate 310 includes a top portion 312 and a bottom portion 314. At 14, a drive circuitry layer 330 is formed on the substrate 310, as depicted in FIG. 11. Further, the drive circuitry layer 330 is formed by complementary metal-oxide-semiconductor (CMOS) implantation, i.e., the drive circuitry layer 330 includes CMOS drive circuitry, and is formed by techniques as known in the art.

Figure 12:
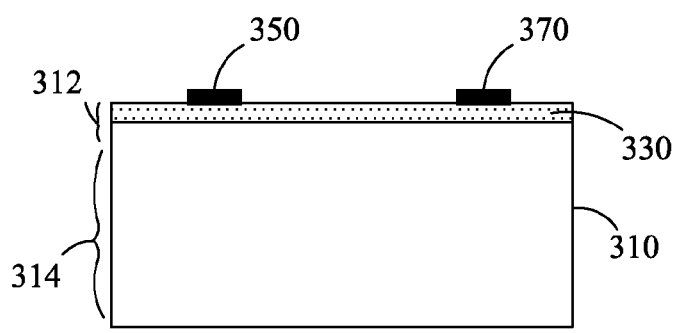

At 16, at least one fluid ejection element, such as fluid ejection elements 350, 370, are fabricated on the substrate 310, and more specifically on the top portion 312 of the substrate 310, as depicted in FIG. 12. Each fluid ejection element of the at least one fluid ejection element, such as the fluid ejection elements 350, 370, is electrically coupled to the drive circuitry layer 330. The fluid ejection elements 350, 370 may be heater resistors or such other elements that receive electrical signals from the drive circuitry layer 330 for energization in order to eject a droplet of fluid (such as ink).

Figure 13:
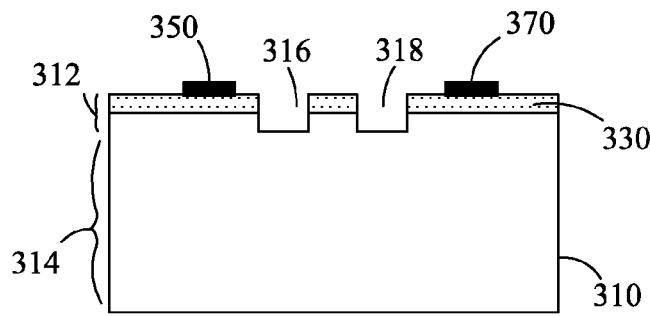

At 18, at least one slot, such as slots 316, 318, is formed within the top portion 312 of the substrate 310, as depicted in FIG. 13. Specifically, the at least one slot is configured as a shaft that serves as a fluid via of the fluid ejection device 300, and may be formed by etching the top portion 312. More specifically, the top portion 312 may be etched by a deep reactive ion etching (DRIE) technique. However, it will be evident that other techniques as known in the art may be used for the formation of the at least one slot. Each slot of the at least one slot may have a depth of about 60 $\mu m$. Further, the each slot may have a width of about 20 $\mu m$. It will be evident that the each slot may have any dimension, as per a manufacturer's preference.

Further, the substrate 310 may be subjected to grinding from the bottom portion 314 of the substrate 310 up to a predetermined height prior to the formation of the at least one slot, such as the slots 316, 318, within the top portion 312 of the substrate 310. Specifically, the height/thickness of the substrate 310 may be reduced by techniques that are known in the art. For example, conventional grinding apparatuses may be used for grinding the substrate 310.

Figure 14:
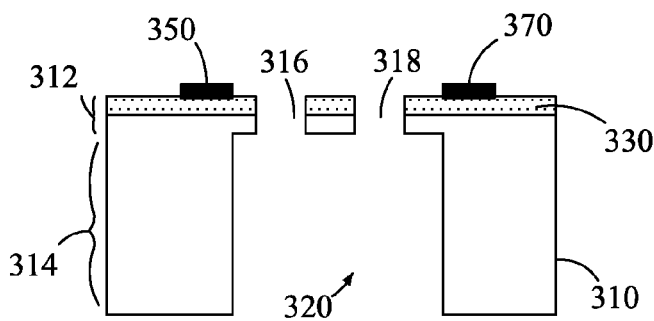

At 20, at least one fluid feed trench, such as a fluid feed trench 320, is formed within the bottom portion 314 of the substrate 310, as depicted in FIG. 14. The at least one fluid feed trench may be formed within the bottom portion 314 of the substrate 310 by etching, and more particularly, DRIE technique, the bottom portion 314. However, it will be evident that other techniques as known in the art may be used for the formation of the at least one fluid feed trench. Each fluid feed trench of the at least one fluid feed trench is in fluid communication with one or more slots of the at least one slot. Specifically, the fluid feed trench 320 is in fluid communication with the slots 316, 318. Further, the each fluid feed trench may have a width of about 300 µm. It will be evident that the each fluid feed trench may have any dimension, as per a manufacturer's preference.

Further, a layer (not shown) of an etch-stop material may be deposited over the top portion 312 of the substrate 310 while filling the at least one slot with the etch-stop material, prior to forming the at least one fluid feed trench, such as the fluid feed trench 320, within the bottom portion 314 of the substrate 310. Etch-stop materials that are known in the art may be utilized for the purpose of the present disclosure. Suitable examples of the etch-stop material include, but are not limited to, a positive photoresist material, and a negative photoresist material. Further, the layer of the etch-stop material may be formed/deposited over the substrate 310 using conventional techniques, such as a coating technique (spin-coating or spray-coating) and a lamination process. Furthermore, such a layer of the etch-stop material may then be removed from the top portion 312 of the substrate 310 after the formation of the at least one fluid feed trench, such as the fluid feed trench 320.

Figure 15:
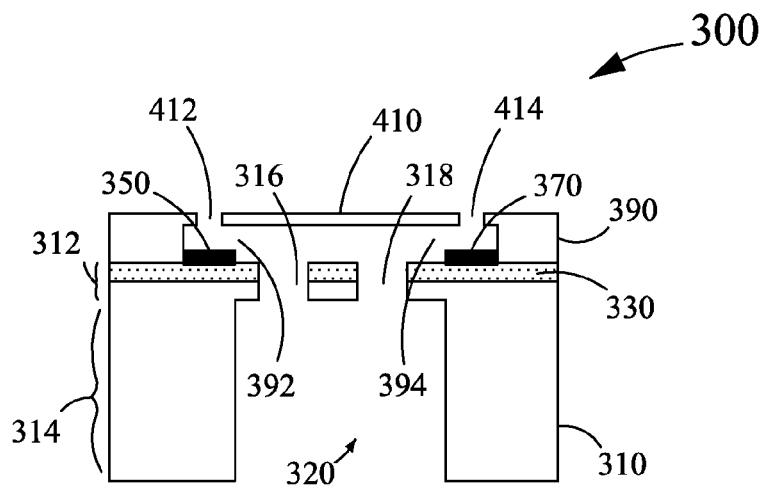

At 22, a flow feature layer 390 and a nozzle plate 410 are laminated over the substrate 310 having the at least one slot, such as the slots 316, 318 and the at least one fluid feed trench, such as the fluid feed trench 320, formed therewithin, as depicted in FIG. 15. The flow feature layer 390 includes at least one flow feature (fluid chamber and fluid supply channel), such as flow features 392, 394. Each flow feature of the at least one flow feature is in fluid communication with one or more corresponding slots of the at least one slot. Specifically, the flow feature 392 is in fluid communication with the slot 316, and the flow feature 394 is in fluid communication with the slot 318. The nozzle plate 410 includes at least one nozzle, such as nozzles 412, 414. Each nozzle of the at least one nozzle is in fluid communication with one or more corresponding flow features of the at least one flow feature. Specifically, the nozzle 412 is in fluid communication with the flow feature 392, and the nozzle 414 is in fluid communication with the flow feature 394. The flow feature layer 390 and the nozzle plate 410 may be composed of suitable polymeric materials that are known in the art. Further, the nozzle plate 410 may be a photo-imageable nozzle plate, and may be laminated with the flow feature layer 390 as a single unit, as depicted in FIG. 15. However, it should be evident that the flow feature layer 390 and the nozzle plate 410 may be laminated as separate units over the substrate 310.

Lamination of the flow feature layer 390 and the nozzle plate 410 over the substrate 310 results in the fabrication of the fluid ejection device 300, as depicted in FIG. 15. The method 10 ends at 24.

Figure 16:
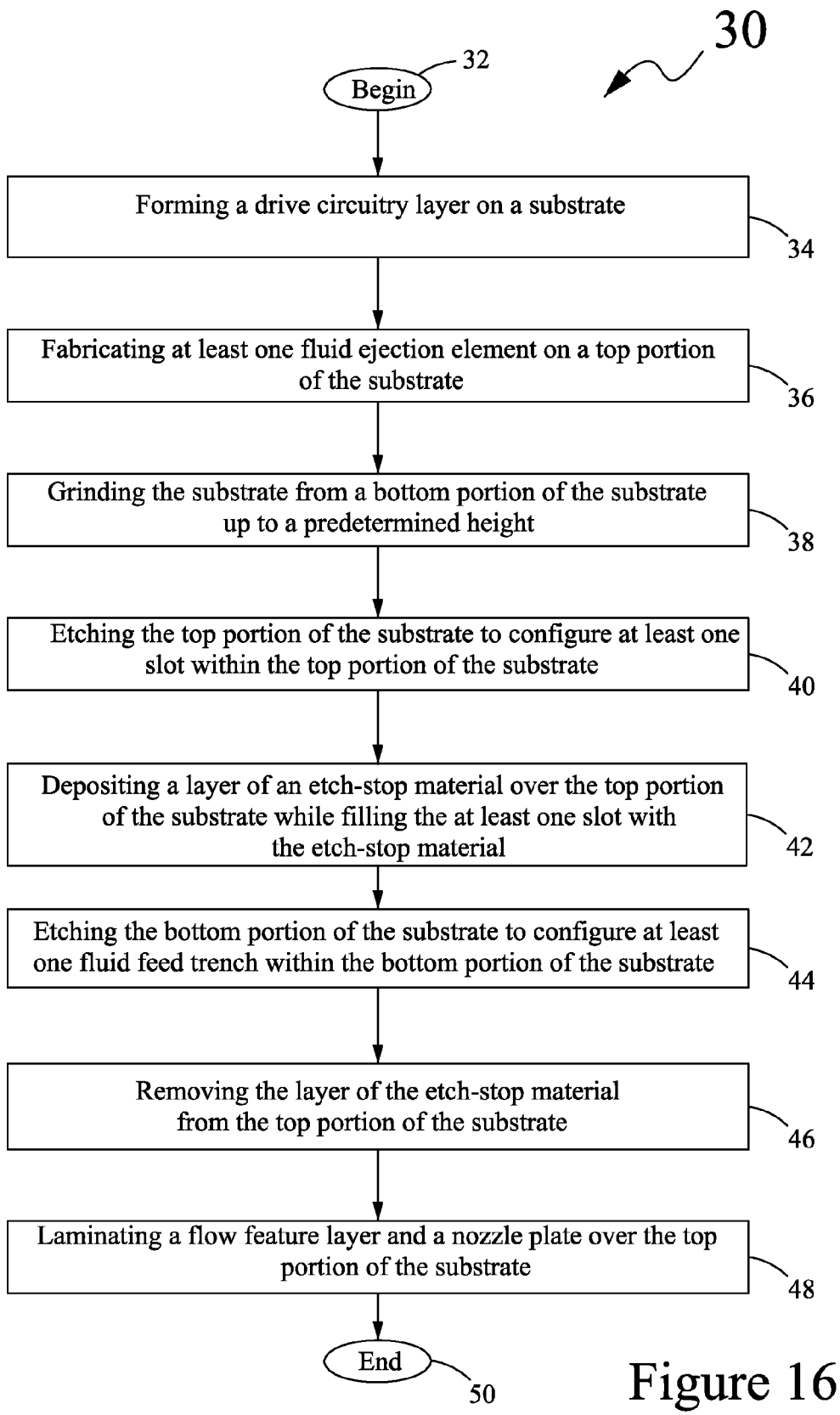
FIG. 16 depicts a flow chart illustrating a method for fabricating a fluid ejection device, in accordance with another embodiment of the present disclosure.
Figure 17:
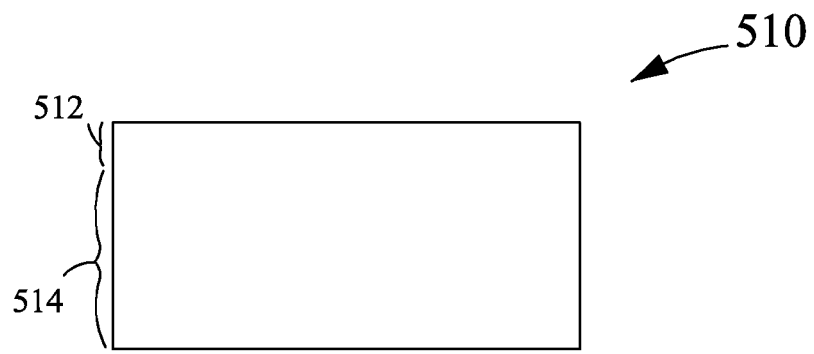
FIGS. 17-23 depict a process flow for the fabrication of the fluid ejection device using the method of FIG. 16.
Figure 18:
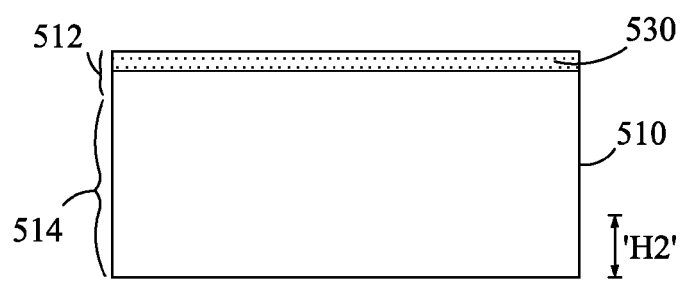

Another embodiment of the method for fabricating a fluid ejection device 500 is explained in conjunction with FIGS. 16 and 17-23. Referring to FIG. 16, the method 30 begins at 32. A substrate 510 is provided, as depicted in FIG. 17. The substrate 510 is similar to the substrate 310 of FIG. 10, and is a silicon wafer and may have a height of about 725 µm. Without departing from the scope of the present disclosure, the substrate 510 may have any shape and size as per a manufacturer's preference. Further, the substrate 510 may be composed of any other semi-conductor material that is suitable for the fabrication of fluid ejection devices. The substrate 510 includes a top portion 512 and a bottom portion 514. At 34, a drive circuitry layer 530 is formed on the substrate 510, as depicted in FIG. 18. Specifically, the drive circuitry layer 530 is similar to the drive circuitry layer 330 of FIG. 11, and is formed on the substrate 510. Further, the drive circuitry layer 530 is formed by CMOS implantation, i.e., the drive circuitry layer 530 includes CMOS drive circuitry, and is formed by techniques as known in the art.

Figure 19:
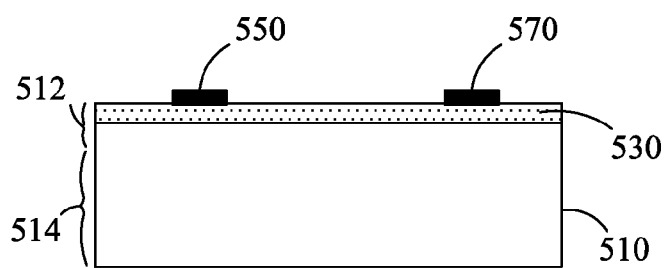

At 36, at least one fluid ejection element, such as fluid ejection elements 550, 570, is fabricated on the substrate 510, as depicted in FIG. 19. Specifically, the at least one fluid ejection element is fabricated on the top portion 512 of the substrate 510. Each fluid ejection element of the at least one fluid ejection element, such as the fluid ejection elements 550, 570, is electrically coupled to the drive circuitry layer 530. The fluid ejection elements 550, 570 may be heater resistors or such other elements that receive electrical signals from the drive circuitry layer 530 for energization in order to eject a droplet of fluid (such as ink).

Subsequently and after the fabrication of the at least one fluid ejection element, the substrate 510 is subjected to grinding from the bottom portion 514 (back-grinding) of the substrate 510 up to a predetermined height, 'H2', at 38 and while referring to FIGS. 18 and 19. Specifically, the substrate 510 may be back-ground to achieve a final height of about 450 µm. Further, the height/thickness of the substrate 510 may be reduced by techniques that are known in the art. For example, conventional grinding apparatuses may be used for grinding the substrate 510.

Figure 20:
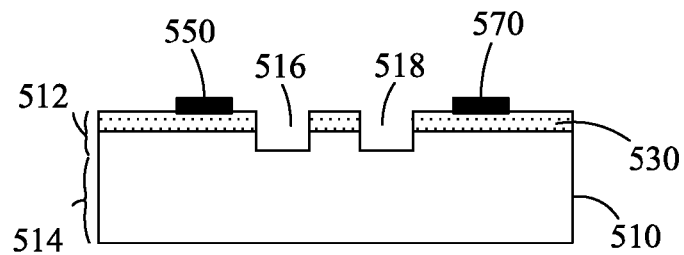

At 40, the top portion 512 of the substrate 510 is etched to form/configure at least one slot, such as slots 516, 518, within the top portion 512 of the substrate 510, as depicted in FIG. 20. Specifically, the top portion 512 may be etched by a DRIE technique. However, it will be evident that other techniques as known in the art may be used for the formation of the at least one slot. Further, each slot of the slots 516, 518 is configured as a shaft that serves as a fluid via of the fluid ejection device 500, and may have a depth of about 60 µm. Further, the each slot may have a width of about 20 µm. It will be evident that the to each slot may have any dimension, as per a manufacturer's preference.

Figure 21:
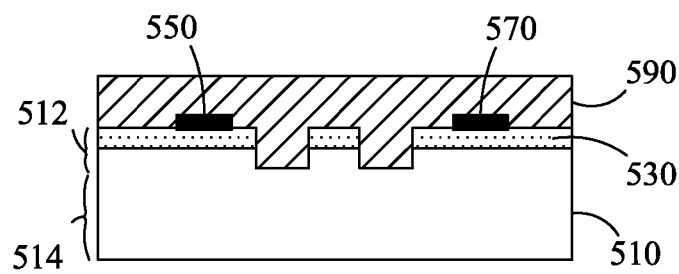

At 42, a layer 590 of an etch-stop material is deposited over the top portion 512 of the substrate 510 while filling the at least one slot, such as the slots 516, 518 with the etch-stop material, as depicted in FIG. 21. Etch-stop materials that are known in the art may be utilized for the purpose of the present disclosure. Suitable examples of the etch-stop material include, but are not limited to, a positive photoresist material, and a negative photoresist material. Further, the layer 590 of the etch-stop material may be formed/deposited over the substrate 510 using conventional techniques, such as a coating technique (spin-coating or spray-coating) and a lamination process.

Figure 22:
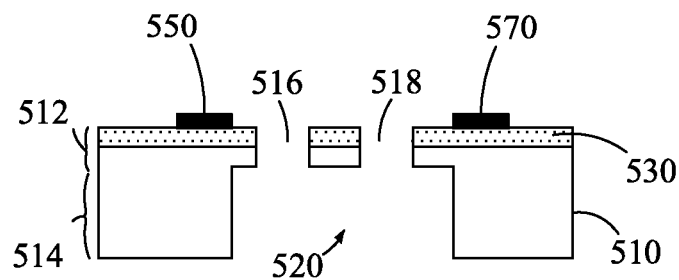

At 44, the bottom portion 514 of the substrate 510 is etched to configure/ form at least one fluid feed trench, such as a fluid feed trench 520, within the bottom portion 514 of the substrate 510, as depicted in FIG. 22. Further, each fluid feed trench of the at least one fluid feed trench is in fluid communication with one or more slots of the at least one slot. Specifically, the fluid feed trench 520 is in fluid communication with the slots 516, 518. Furthermore, the each fluid feed trench may have a width of about 300 µm. It will be evident that the each fluid feed trench may have any dimension, as per a manufacturer's preference. At 46, the layer 590 of the etch-stop material is removed from the top portion 512 of the substrate 510, as depicted in FIG. 22.

Figure 23:
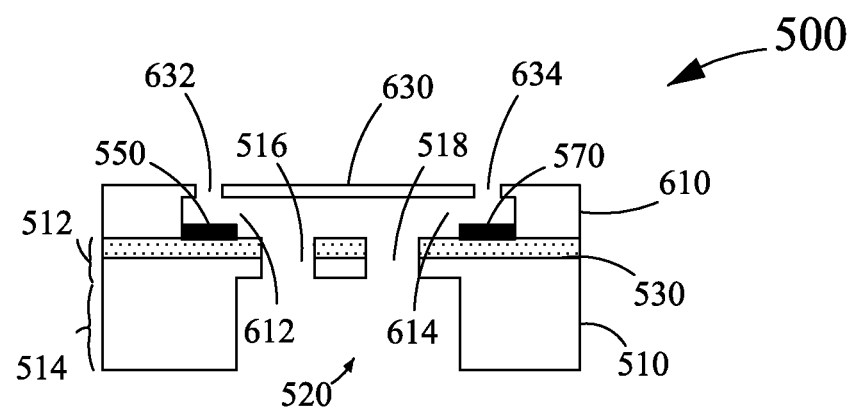

At 48, a flow feature layer 610 and a nozzle plate 630 are laminated over the top portion 512 of the substrate 510 having the at least one slot (such as the slots 516, 518) and the at least one fluid feed trench (such as the fluid feed trench 520) formed therewithin, as depicted in FIG. 23. The flow feature layer 610 includes at least one flow feature (fluid chamber and fluid supply channel), such as flow features 612, 614. Each flow feature of the at least one flow feature is in fluid communication with one or more corresponding slots of the at least one slot. Specifically, the flow feature 612 is in fluid communication with the slot 516, and the flow feature 614 is in fluid communication with the slot 518. The nozzle plate 630 includes at least one nozzle, such as nozzles 632, 634. Each nozzle of the at least one nozzle is in fluid communication with one or more corresponding flow features of the at least one flow feature. Specifically, the nozzle 632 is in fluid communication with the flow feature 612, and the nozzle 634 is in fluid communication with the flow feature 614. The flow to feature layer 610 and the nozzle plate 630 may be composed of suitable polymeric materials that are known in the art. Further, the nozzle plate 630 may be a photo-imageable nozzle plate, and may be laminated with the flow feature layer 610 as a single unit, as depicted in FIG. 23. However, it should be evident that the flow feature layer 610 and the nozzle plate 630 may be laminated as separate units over the substrate 510.

Lamination of the flow feature layer 610 and the nozzle plate 630 over the substrate 510 results in the fabrication of the fluid ejection device 500, as depicted in FIG. 23. The method 30 ends at 50.

In another aspect, the present disclosure provides a fluid ejection device, such as the fluid ejection devices 300, 500 of FIGS. 15 and 23, respectively. The fluid ejection device includes a substrate, such as the substrates 310, 510. The substrate includes a top portion, such as the top portions 312, 512; and a bottom portion, such as the bottom portions 314, 514. Furthermore, the substrate includes at least one slot, such as the slots 316, 318, and 516, 518, formed within the top portion of the substrate. Also, the substrate includes at least one fluid feed trench, such as the fluid feed trenches 320, 520, formed within the bottom portion of the substrate. Each fluid feed trench of the at least one fluid feed trench is in fluid communication with one or more slots of the at least one slot.

In addition, the fluid ejection device includes a drive circuitry layer, such as the drive circuitry layers 330, 530, formed on the substrate. Moreover, the fluid ejection device includes at least one fluid ejection element, such as the fluid ejection elements 350, 370, and 550, 570, fabricated on the top portion of the substrate and electrically coupled to the drive circuitry layer. Additionally, the fluid ejection device includes a flow feature layer, such as the flow feature layers 390, 610, laminated over the top portion of the substrate having the at least one slot and the at least one fluid feed trench formed therewithin. Further, the fluid ejection device includes a nozzle plate, such as the nozzle plates 410, 630, laminated over the flow feature layer. In the fluid ejection device of the present disclosure, the at least one slot and the at least one fluid feed trench are formed within the substrate prior to the lamination of the flow feature layer and the nozzle plate.

As the fluid ejection device of the present disclosure is similar to the fluid ejection devices 300, 500, accordingly, a detailed description of the fluid ejection device of the present disclosure is avoided herein for the sake of brevity.

Based on the aforementioned, the present disclosure provides an effective method, such as the methods 10, 30, for fabricating fluid ejection devices. The method employs etching (DRIE technique) prior to forming (laminating) a flow feature layer and a nozzle plate, i.e., polymeric layers on a substrate. Therefore, etching in the absence of any polymeric layer assists in conducting aggressive post-DRIE clean-ups. Accordingly, the present disclosure serves as a successful attempt for performing DRIE technique prior to the formation of the polymeric layers, while emphasizing on the potential of the sequence and the manner in which formation of slots and/or fluid feed trenches (by etching) is accomplished prior to the lamination of the polymeric layers. Further, sequential processing of the flow feature layer and the nozzle plate assists in improving adhesion and averts any corrosion of the fluid ejection devices. In addition, back-grinding (thinning/reducing thickness or height) of the substrate (wafer) of the fluid ejection devices assists in improving etch exit hole accuracy and uniformity while reducing etch tilt across the substrate and reducing the cost of DRIE technique substantially. Moreover, laminated resists that are used for the flow feature layer and the nozzle plate have much better thickness uniformity as compared to spin-coated resists.

The foregoing description of several embodiments of the present disclosure has been presented for purposes of illustration. It is not intended to be exhaustive or to limit the disclosure to the precise forms disclosed, and obviously many modifications and variations are possible in light of the above teaching. It is intended that the scope of the disclosure be defined by the claims appended hereto.

The invention claimed is:

1. A method for fabricating a fluid ejection device, the method comprising:
    forming a drive circuitry layer on a substrate;
    fabricating at least one fluid ejection element on a top portion of the substrate, each fluid ejection element of the at least one fluid ejection element being electrically coupled to the drive circuitry layer;
    grinding the substrate from a bottom portion of the substrate up to a predetermined height;
    etching the top portion of the substrate to configure at least one slot within the top portion of the substrate;
    depositing a layer of an etch-stop material over the top portion of the substrate while filling the at least one slot with the etch-stop material;
    etching the bottom portion of the substrate to configure at least one fluid feed trench within the bottom portion of the substrate, wherein each fluid feed trench of the at least one fluid feed trench is in fluid communication with one or more slots of the at least one slot;
    removing the layer of the etch-stop material from the top portion of the substrate; and
    laminating a flow feature layer and a nozzle plate as a single unit over the top portion of the substrate having the at least one slot and the at least one fluid feed trench configured therewithin after all etching has been completed, wherein at least a portion of the flow feature layer is laminated in a plane defined by the nozzle plate.

2. The method of claim 1, wherein the drive circuitry layer is formed by complementary metal-oxide-semiconductor implantation.

3. The method of claim 1, wherein the top portion is etched by a deep reactive ion etching technique.

4. The method of claim 1, wherein the flow feature layer comprises at least one flow feature, each flow feature of the at least one flow feature being in fluid communication with one or more corresponding slots of the at least one slot.

5. The method of claim 4, wherein the nozzle plate comprises at least one nozzle, each nozzle of the at least one nozzle being in fluid communication with one or more corresponding flow features of the at least one flow feature.

* * * * *